(12) United States Patent
Hsieh

(10) Patent No.: US 8,587,054 B2
(45) Date of Patent: Nov. 19, 2013

(54) TRENCH MOSFET WITH RESURF STEPPED OXIDE AND DIFFUSED DRIFT REGION

(75) Inventor: Fu-Yuan Hsieh, New Taipei (TW)

(73) Assignee: Force MOS Technology Co., Ltd., New Taipei (TW)

(*) Notice: Subject to any disclaimer, the term of this patent is extended or adjusted under 35 U.S.C. 154(b) by 33 days.

(21) Appl. No.: 13/341,349

(22) Filed: Dec. 30, 2011

(65) Prior Publication Data
US 2013/0168760 A1 Jul. 4, 2013

(51) Int. Cl.
*H01L 29/66* (2006.01)
(52) U.S. Cl.
USPC .................................................. 257/331
(58) Field of Classification Search
CPC ............ H01L 29/7813; H01L 29/4236; H01L 29/66734

USPC .......................................... 257/330, 329, 331
See application file for complete search history.

(56) References Cited

U.S. PATENT DOCUMENTS

| 7,791,132 | B2 | 9/2010 | Banerjee et al. | |
|---|---|---|---|---|
| 7,829,944 | B2 | 11/2010 | Disney | |
| 8,067,800 | B2* | 11/2011 | Hsieh | 257/331 |
| 8,373,225 | B2* | 2/2013 | Hsieh | 257/331 |
| 2012/0187477 | A1* | 7/2012 | Hsieh | 257/331 |

* cited by examiner

*Primary Examiner* — Nikolay Yushin
(74) *Attorney, Agent, or Firm* — Bacon & Thomas, PLLC

(57) ABSTRACT

A trench MOSFET with split gates and diffused drift region for on-resistance reduction is disclosed. Each of the split gates is symmetrically disposed in the middle of the source electrode and adjacent trench sidewall of a deep trench. The inventive structure can save a mask for definition of the location of the split gate electrodes. Furthermore, the fabrication method can be implemented more reliably with lower cost.

15 Claims, 19 Drawing Sheets

TRENCH MOSFET WITH RESURF STEPPED OXIDE AND DIFFUSED DRIFT REGION

FIELD OF THE INVENTION

This invention relates generally to the cell structure, device configuration and fabrication process of semiconductor power devices. More particularly, this invention relates to a novel and improved cell structure, device configuration and improved fabrication process of a trench MOSFET (Metal Oxide Semiconductor Field Effect Transistor).

BACKGROUND OF THE INVENTION

Please refer to FIG. 1A for a trench MOSFET 100 disclosed in a prior art of U.S. Pat. No. 7,829,944 and U.S. Pat. No. 7,791,132 having split gate electrodes (101-1 and 101-2), wherein each of the split gate electrodes (101-1 and 101-2) is asymmetrically disposed in a thick insulation layer 102 between a field plate 103 and trench sidewalls of a deep trench 104, and isolated from the trench sidewall of the deep trench 104 by a gate oxide 105. FIG. 1B shows manufacturing process for forming the split gate electrodes (101-1 and 101-2) of the trench MOSFET 100 of FIG. 1A according to the same prior art, wherein a patterned mask layer (not shown) is applied and followed by dry or wet oxide etching steps to form gate trenches 106 into the thick insulation layer 102 to achieve the asymmetrical disposition of the split gate electrodes (101-1 and 101-2 in FIG. 1A). That is to say, an additional mask for definition of the location of the split gate electrodes is required in the prior art, which is not cost effective for mass production.

FIG. 1C is a plot showing normalized drift region doping profile versus normalized distance from a P-body region in a N-channel MOSFET, wherein the curve 123 illustrates a dual-gradient doping in drift region according to the prior art U.S. Pat. No. 7,791,132; that is, the doping concentration in the drift region nearest the P-body region (i.e., nearest the source) has a first gradient, and the doping concentration in the drift region farther from the P-body region (i.e., nearest the drain) has a second gradient, with the latter gradient being larger than the former. Plots 120 and 121 depict single-gradient doping concentration profiles optimized for the off state and on-state Vbd (breakdown voltage) respectively. As shown in FIG. 1C, multiple epitaxial layers with different gradient doping profiles are required, which is also not cost effective for mass production. Moreover, it is difficult to control the various gradient doping profiles in the manufacturing process.

Therefore, there is still a need in the art of the semiconductor power device, particularly for trench MOSFET design and fabrication, to provide a novel cell structure, device configuration and fabrication process that would resolve these difficulties and reduce the manufacturing cost.

SUMMARY OF THE INVENTION

The present invention provides a trench MOSFET with resurf stepped oxide (RSO) which only requires a single epitaxial layer and no additional mask for split gate electrodes to achieve a better cost effective than the prior arts. Moreover, the present invention also provides a diffused drift region having a higher doping concentration than the epitaxial layer, whose doping profile is much easier to control than the multiple epitaxial layers in the prior arts.

In one aspect, the present invention features a trench MOSFET having resurf stepped oxide comprising: a substrate of a first conductivity type; an epitaxial layer of the first conductivity type onto the substrate, wherein the epitaxial layer has a lower doping concentration than the substrate; a plurality of gate trenches formed from a top surface of the epitaxial layer and extending downward into the epitaxial layer in an active area; a first gate insulation layer formed along trench sidewalls of a lower portion of each of the gate trenches; a source electrode formed within each of the gate trenches and surrounded by the first gate insulation layer in the lower portion of each of the gate trenches; a second gate insulation layer formed at least along trench sidewalls of an upper portion of each of the gate trenches and upper sidewalls of the source electrode above the first gate insulation layer, the second gate insulation layer having a thinner thickness than the first gate insulation layer; and a pair of split gate electrodes disposed above the first gate insulation layer and adjacent to the second gate insulation layer in the upper portion of each of the gate trenches, wherein each of the split gate electrodes is disposed in the middle between the source electrode and adjacent trench sidewall in each of the gate trenches. Therefore, comparing with the prior art, no additional mask is required for definition of the split gate electrodes in the present invention, and one mask is saved. Meanwhile, each of the split gate electrodes is symmetrically disposed in the middle of the source electrode (field plate in the prior arts) and adjacent trench sidewall of each of the gate trenches.

In another aspect, the present invention features a diffused drift region in a mesa between two adjacent gate trenches by performing an angle ion implantation of the first conductivity type, which is the same conductivity type as the epitaxial layer, followed by a diffusion step, wherein the diffused region has a higher doping concentration than the epitaxial layer for on-resistance reduction. Cost of formation of the diffused drift region is much more cost effective than the multiple epitaxial layers in the prior arts. Moreover, the doping concentration of the diffused drift region is much easier to control than the multiple epitaxial layers in the prior arts. Meanwhile, because of the diffusion method, the diffused drift has a higher doping concentration near the trench sidewalls of the gate trenches than in the center of the mesa.

In another aspect, the present invention features a trench MOSFET having a resurf stepped oxide and a diffused drift region comprising: a substrate of a first conductivity type; an epitaxial layer of the first conductivity type onto the substrate, wherein the epitaxial layer has a lower doping concentration than the substrate; a plurality of gate trenches formed from a top surface of the epitaxial layer and extending downward into the epitaxial layer in an active area; a first gate insulation layer formed along trench sidewalls of a lower portion of each of the gate trenches; a source electrode formed within each of the gate trenches and surrounded by the first gate insulation layer in the lower portion of each of the gate trenches; a second gate insulation layer formed at least along trench sidewalls of an upper portion of each of the gate trenches and upper sidewalls of the source electrode above the first gate insulation layer, the second gate insulation layer having a thinner thickness than the first gate insulation layer; a pair of split gate electrodes of a second conductivity type disposed above the first gate insulation layer and adjacent to the second gate insulation layer in the upper portion of each of the gate trenches, wherein each of the split gate electrodes disposed in the middle between the source electrode and adjacent trench sidewall in each of the gate trenches; a diffused drift region of the first conductivity having a higher doping concentration than the epitaxial layer, disposed in a mesa between every two adjacent gate trenches; the diffused drift region having a higher doping concentration near the trench sidewalls of the gate trenches than in center of the mesa; a body region of the second conductivity type formed in the mesa, above a top surface of the diffused drift region; and a source region of the first conductivity type formed near a top surface of the body region and adjacent to the split gate electrodes.

Preferred embodiments include one or more of the following features: the source electrode and the split gate electrode comprise a doped poly-silicon of the first conductivity type; the source electrode comprises a doped poly-silicon of a second conductivity type or the first conductivity type, and the split gate electrodes comprise a doped poly-silicon of the first conductivity type; trench bottoms of the gate trenches are above a common interface between the substrate and the epitaxial layer; the gate trenches further extend into the substrate; the trench MOSFET further comprises a trenched source-body contact filled with a contact metal plug, penetrating through the source region and extending into the body region; the trench MOSFET further comprises a body contact doped region of the second conductivity type within the body region and surrounding at least bottom of the trenched source-body contact underneath the source region, wherein the body contact doped region has a higher doping concentration than the body region; the trench MOSFET further comprises a termination area which comprises a guard ring connected with the source region, and multiple floating guard rings having floating voltage, wherein the guard ring and the multiple floating guard rings of the second conductivity type have junction depths greater than the body region; the trench MOSFET further comprises a termination area which comprises multiple floating trenched gates having floating voltage and being spaced apart by mesas comprising the body region, wherein the floating trenched gates each comprises a source electrode and a pair of split gate electrodes same as those in the gate trenches in the active area; the trench MOSFET further comprises a termination area which comprises multiple floating trenched gates having floating voltage and being spaced apart by mesas without having the body region, wherein the floating trenched gates each comprises a source electrode and a pair of split gate electrodes same as those in the gate trenches in the active area; the contact metal plug is a tungsten metal layer padded by a barrier metal layer of Ti/TiN or Co/TiN; the contact metal plug is Al alloys or Cu padded by a barrier metal layer of Ti/TiN or Co/TiN or Ta/TiN, wherein the contact metal plug also extends onto a contact interlayer to be respectively patterned as a source metal or a gate metal; the trench MOSFET further comprises at least a trenched source electrode contact filled with a contact metal plug connecting the source electrode to a source metal; the trench MOSFET further comprises at least a gate contact trench filled with a source electrode and a pair of split gate electrodes for gate connection, wherein the split gate electrodes in the gate contact trench are connected to a gate metal through at least a trenched gate contact filled with a contact metal plug.

The invention also features a method for manufacturing a trench MOSFET comprising the steps of: (a) growing an epitaxial layer of a first conductivity type upon a substrate of the first conductivity type, wherein the epitaxial layer having a lower doping concentration than the substrate; (b) forming a hard mask such as an oxide onto a top surface of the epitaxial layer for definition of a plurality of gate trenches; (c) forming the plurality of gate trenches, and mesas between two adjacent gate trenches in the epitaxial layer by etching through open regions in the hard mask; (d) keeping the hard mask substantially covering the mesas after formation of the gate trenches to block sequential angle ion implantation into top surfaces of the mesas; (e) carrying out an angle Ion Implantation of the first conductivity type dopant into the mesas through trench sidewalls of the gate trenches followed by a diffusion step to form a plurality of diffused drift regions in the mesas; (f) removing the hard mask after formation of the diffused drift regions; (g) forming a thick oxide layer along inner surfaces of the gate trenches by thermal oxide growth or oxide deposition; (h) depositing a first doped poly-silicon layer filling the gate trenches to serve as source electrodes; (i) etching back the source electrodes from the top surface of the epitaxial layer; (j) etching back the thick oxide layer from the top surface of the epitaxial layer and an upper portion of the gate trenches; (k) forming a thin oxide layer covering a top surface of the thick oxide layer, along upper inner surfaces of the gate trenches and along sidewalls of the source electrodes above the top surface of the thick oxide layer; (l) depositing a second doped poly-silicon layer filling the upper portion of the gate trenches to serve as split gate electrodes; (m) etching back the split gate electrodes by CMP (Chemical Mechanical Polishing) or plasma etch; (n) carrying out a body implantation of the second conductivity type dopant and a step of body diffusion to form body regions; (o) applying a source mask onto the top surface of the epitaxial layer; and (p) carrying out a source implantation of the first conductivity type dopant and a source diffusion to form source regions.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 2A:
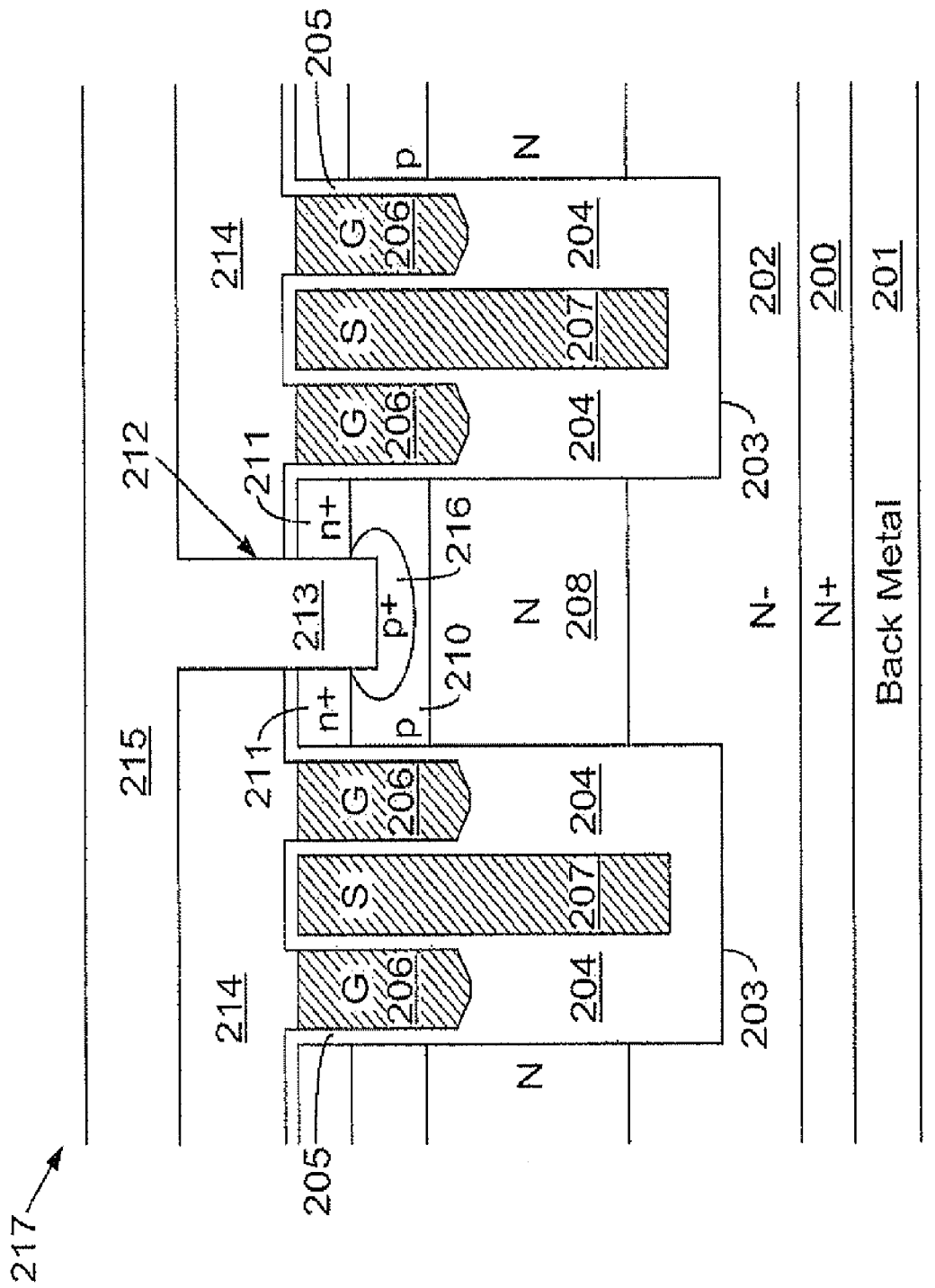
FIG. 2A is a cross-sectional view of a preferred embodiment according to the present invention.

Please refer to FIG. 2A for a preferred embodiment of this invention wherein an N-channel trench MOSFET 217 is formed in an N− epitaxial layer 202 onto an N+ substrate 200 coated with a back metal 201 of Ti/Ni/Ag on rear side as a drain metal. A plurality of gate trenches 203 are formed starting from a top surface of the N− epitaxial layer 202 and extending downward into the N− epitaxial layer 202 in an active area, wherein trench bottoms of the gate trenches 203 are above a common interface between the substrate 200 and the N− epitaxial layer 202. Each of the gate trenches 203 is filled with: a first gate insulation layer 204 formed along trench sidewalls of a lower portion of each of the gate trenches 203; a source electrode (S, as illustrated) 207 formed within each of the gate trenches 203 and surrounded by the first gate insulation layer 204 in the lower portion of each of the gate trenches 203; a second gate insulation layer 205 formed at least along trench sidewalls of an upper portion of each of the gate trenches 203 and upper sidewalls of the source electrode 207 above the first gate insulation layer 204, wherein the second gate insulation layer 205 has a thinner thickness than the first gate insulation layer 204; and a pair of split gate electrodes 206 disposed above the first gate insulation layer 204 and close to the second gate insulation layer 205 in the upper portion of each of the gate trenches 203, wherein each of the split gate electrodes 206 is disposed in the middle between the source electrode 207 and adjacent trench sidewall in each of the gate trenches 203. The source electrode 207 and the split gate electrodes 206 comprise a doped poly-silicon of N conductivity type. As an alternative, the source electrode 207 can be implemented comprising a doped poly-silicon of P conductivity type and the split gate electrodes 206 can be implemented comprising a doped poly-silicon of N conductivity type. For further reducing the on-resistance, the N-channel trench MOSFET 217 can be implemented by further comprising an N diffused drift region 208 which has a higher doping concentration than the epitaxial layer 202 and is disposed in a mesa between every two adjacent gate trenches 203, wherein the N diffused drift region 208 has a higher doping concentration near the trench sidewalls of the gate trenches 203 than in the center of the mesa. According to the present invention, cost of formation of the N diffused drift region 208 is much more cost effective than the multiple epitaxial layers in the prior arts. Moreover, the doping profile of the N diffused drift region 208 is much easier to control than the multiple epitaxial layers in the prior arts. Above a top surface of the N diffused drift region 208, a p body region 210 is formed in the mesa with an n+ source region 211 near a top surface of the p body region 210 and adjacent to the split gate electrodes 206. A trenched source-body contact 212 filled with a contact metal plug 213 is penetrating through a contact interlayer 214, the n+ source region 211 and extending into the p body region 210, wherein the contact metal plug 213 is Al alloys or Cu padded by a barrier metal layer of Ti/TiN or Co/TiN or Ta/TiN, the contact metal plug 213 is also extended onto the contact interlayer 214 to act as a source metal 215 connected to the n+ source region 211 and the p body region 210. As an alternative, the contact metal plug 213 can be implemented by using a tungsten metal layer padded by a barrier metal layer of Ti/TiN or Co/TiN, and the source metal can be implemented by using the Al alloys or Cu which is overlying onto the contact interlayer 214 and the contact metal plug. The n+ source region 211 has a uniform doping concentration and junction depth between sidewalls of the trenched source-body contact 212 to adjacent channel regions near the trench sidewalls of the gate trenches 203. A p+ body contact doped region 216 is formed within the p body region 210, surrounding at least bottom of the trenched source-body contact 212 underneath the n+ source region 211 to further reduce the contact resistance between the contact metal plug 213 and the p body region 210.

Figure 2B:
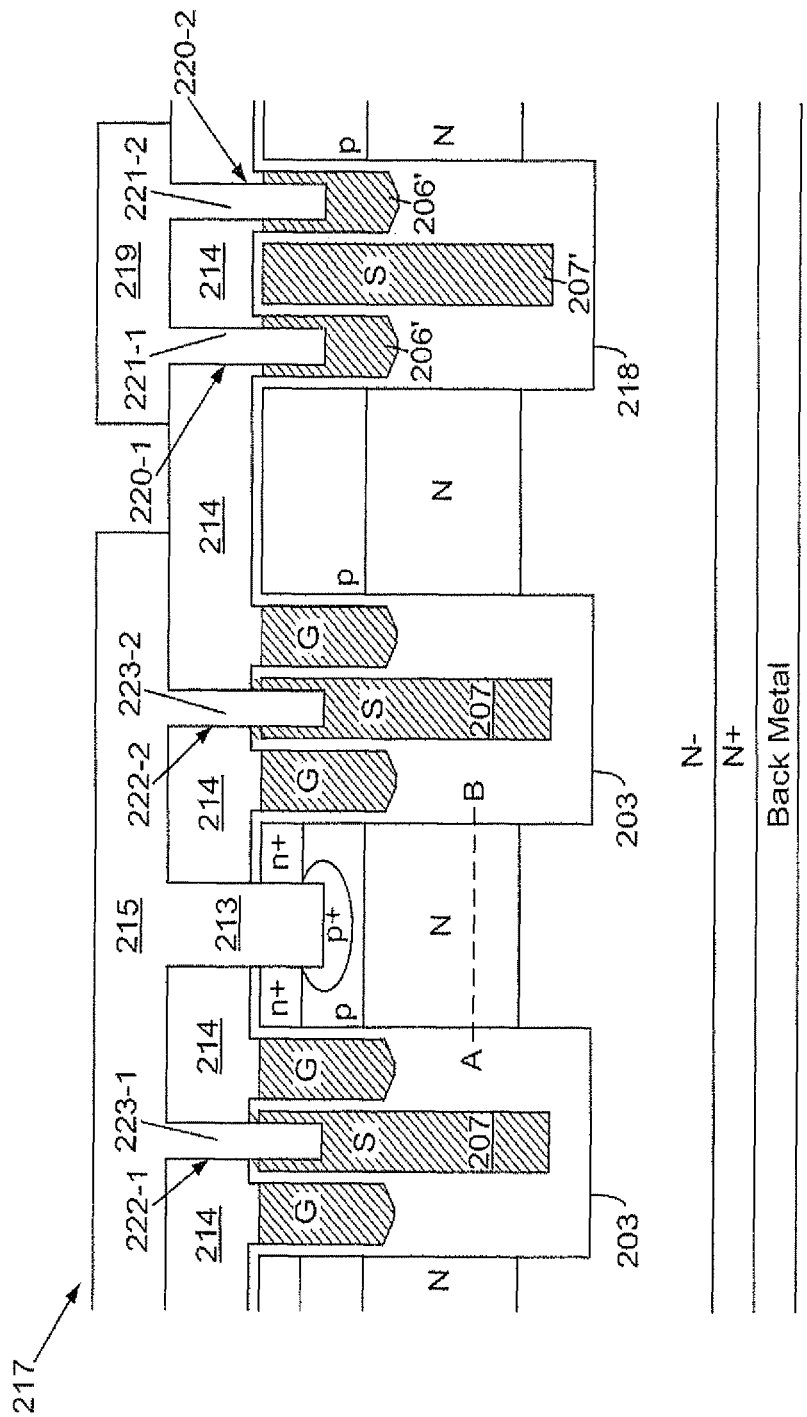
FIG. 2B is another cross-sectional view of the preferred embodiment according to the present invention.

FIG. 2B shows another cross-sectional view of the trench MOSFET 217 of FIG. 2A for showing how the source electrode and the split gate electrodes are connected to the source metal and a gate metal respectively. As illustrated, a plurality of trenched source electrode contacts (222-1 and 222-2) filled with the contact metal plugs (223-1 and 223-2, which are the same as the contact metal plug 213 in FIG. 2A) are penetrating through the contact interlayer 214 and extending into the source electrodes 207 and connecting the source electrodes 207 to the source metal 215. And the trench MOSFET 217 further comprises a gate contact trench 218 filled with the source electrode 207' and a pair of the split gate electrodes 206', which are the same as those in the gate trenches 203 in the active area, for gate connection. A plurality of trenched gate contacts (220-1 and 220-2) filled with the contact metal plugs (221-1 and 221-2, which are the same as the contact metal plug 213 in FIG. 2A) are extending through the contact interlayer 214 and extending into the split gate electrodes 206' and connecting the split gate electrodes 206' to a gate metal 219 which is overlying onto the contact interlayer 214.

Figure 1A:
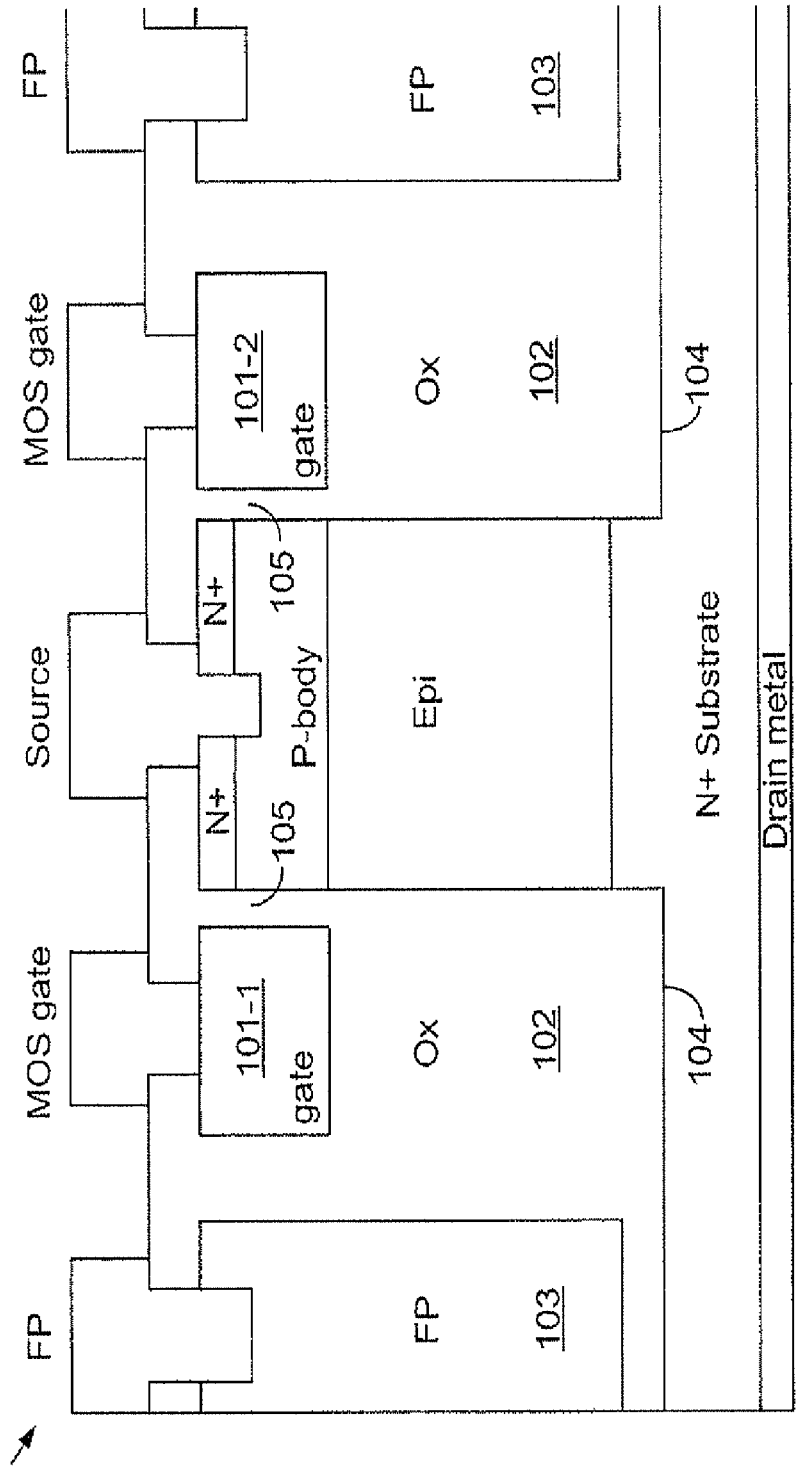
FIG. 1A is a cross-sectional view of a trench MOSFET with resurf stepped oxide of a prior art.
Figure 1B:
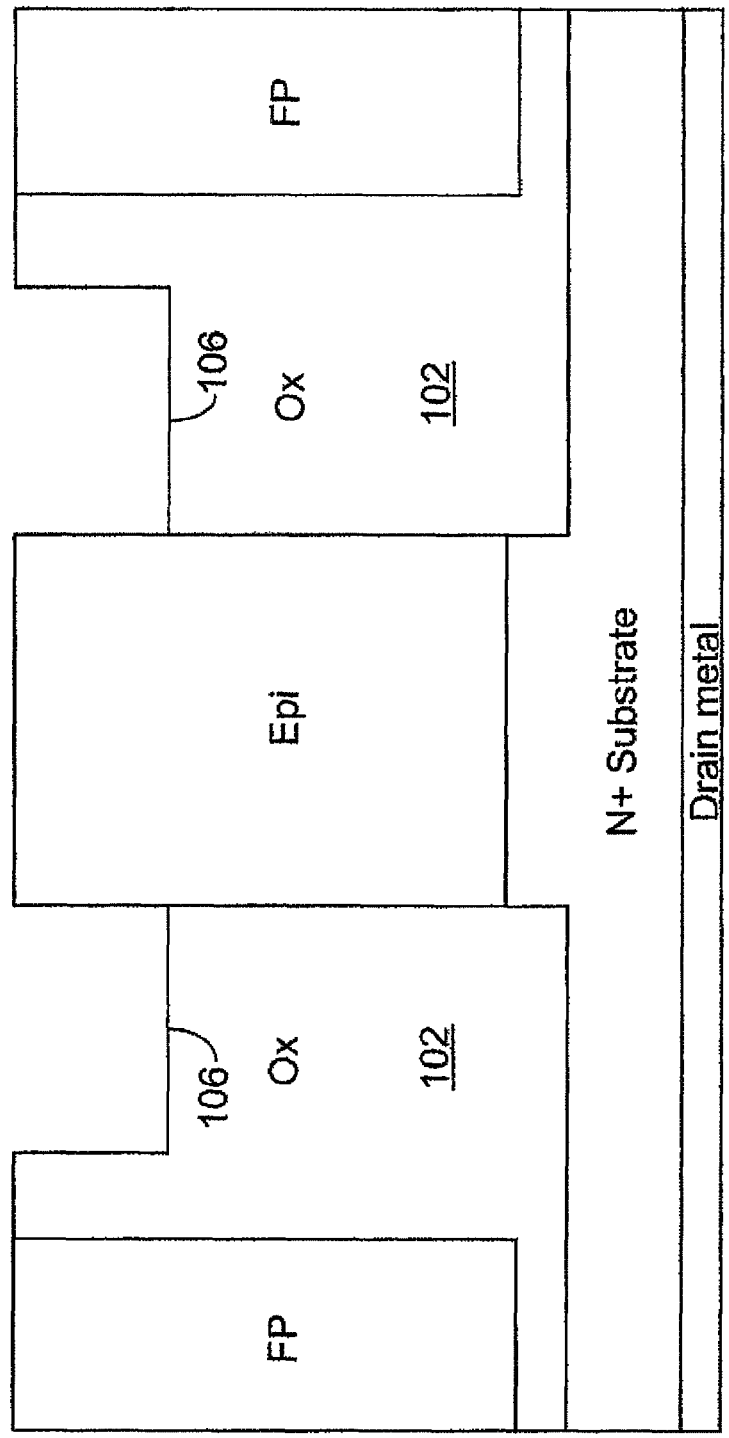
FIG. 1B is a cross-sectional view for showing manufacturing process for forming the split gate electrodes of the trench MOSFET of FIG. 1A of the prior art.
Figure 1C:
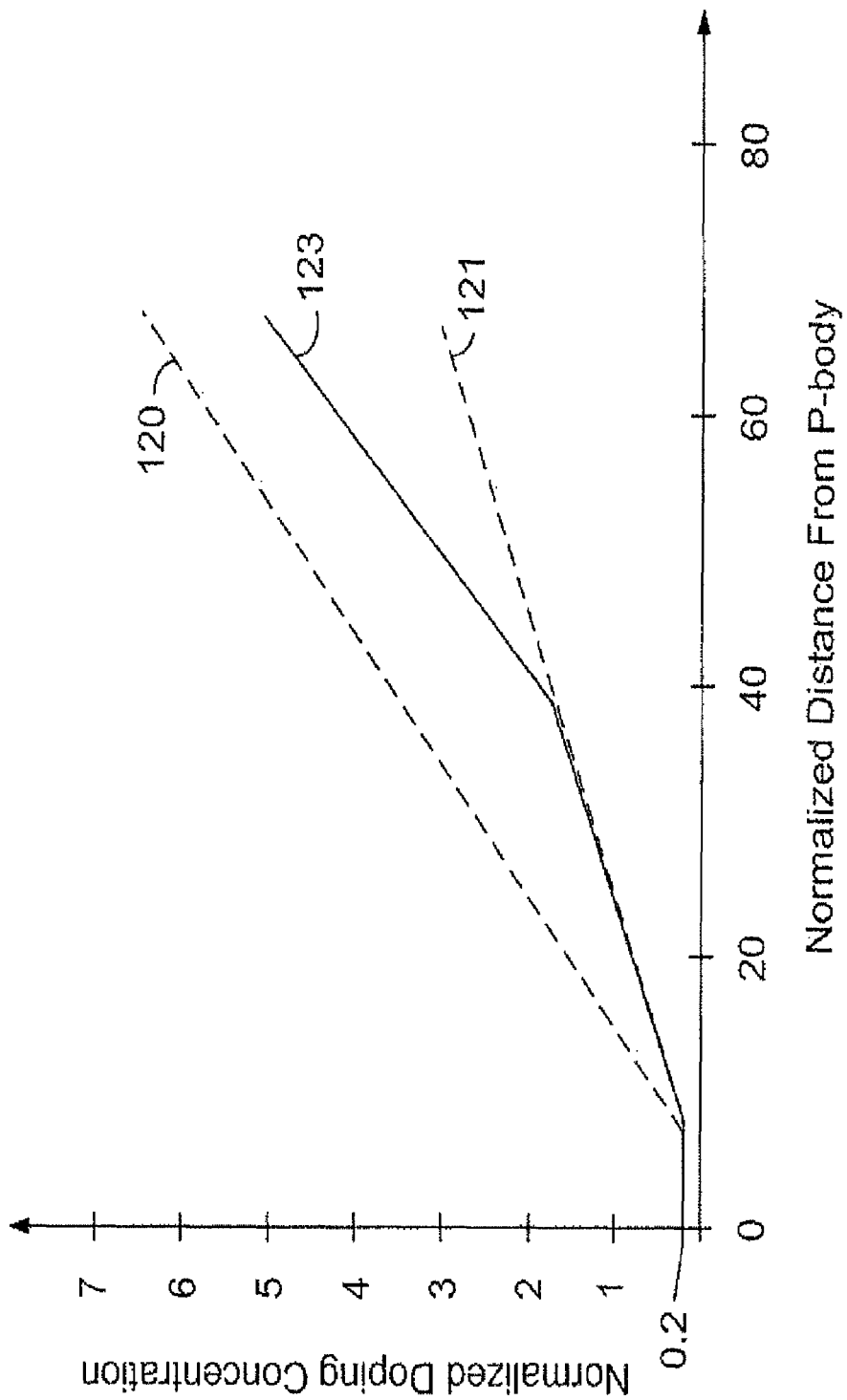
FIG. 1C is a plot showing normalized drift region doping profile versus normalized distance from the P-body region for a two gradient device according to another prior art.
Figure 2C:
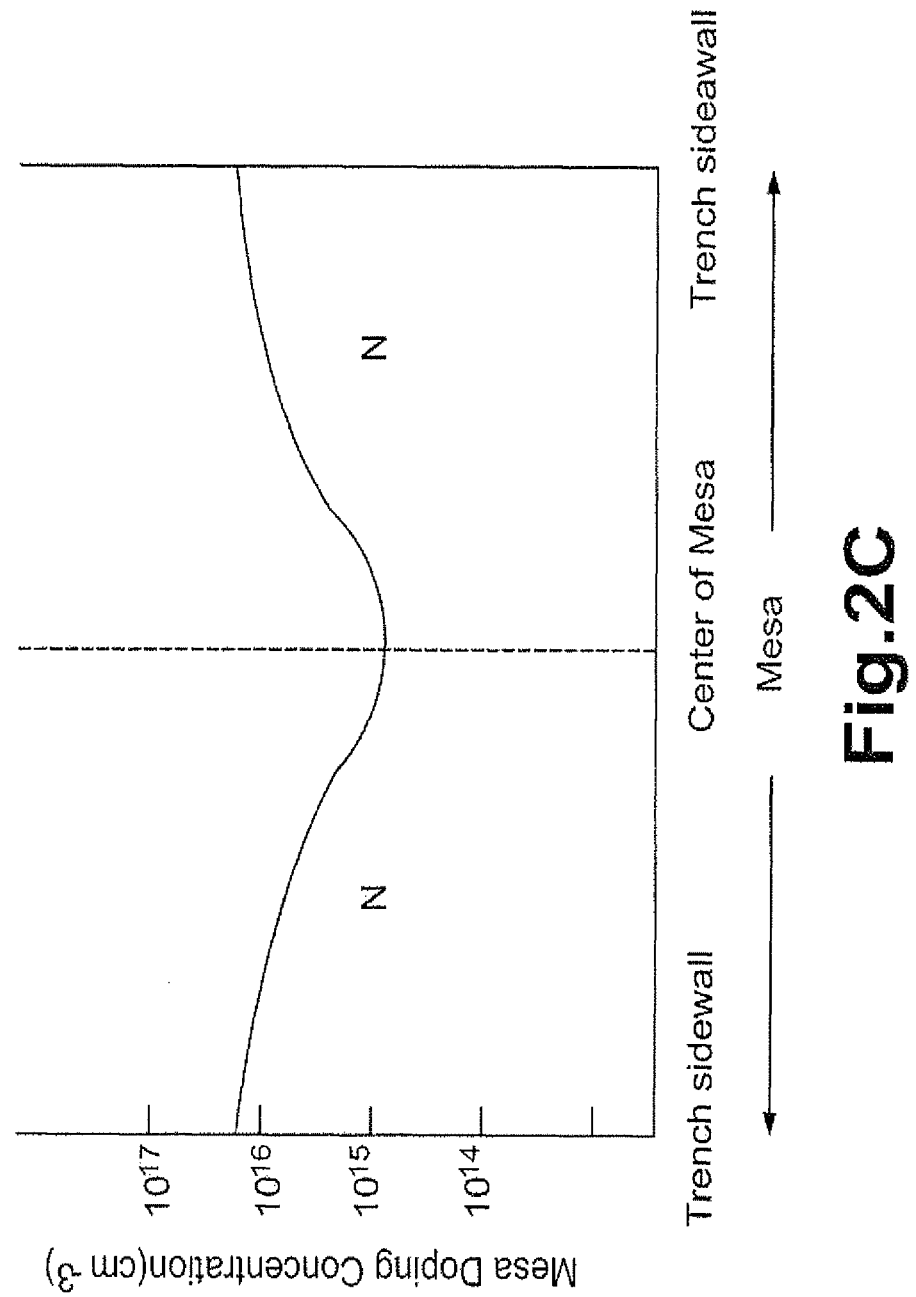
FIG. 2C is a plot showing mesa doping profile along the cross section A-B in FIG. 2B according to the present invention.

FIG. 2C is a plot showing mesa doping profile along the cross section A-B in FIG. 2B according to the present invention. As shown in FIG. 2C, the N diffused drift region 208 in FIG. 2B has a higher doping concentration near the trench sidewalls of the gate trenches 203 than in center of the mesa. The doping profile of the N diffused drift region 208 of FIG. 2C is much easier to control than the doping profile of the multiple epitaxial layers of FIG. 1C.

Figure 3:
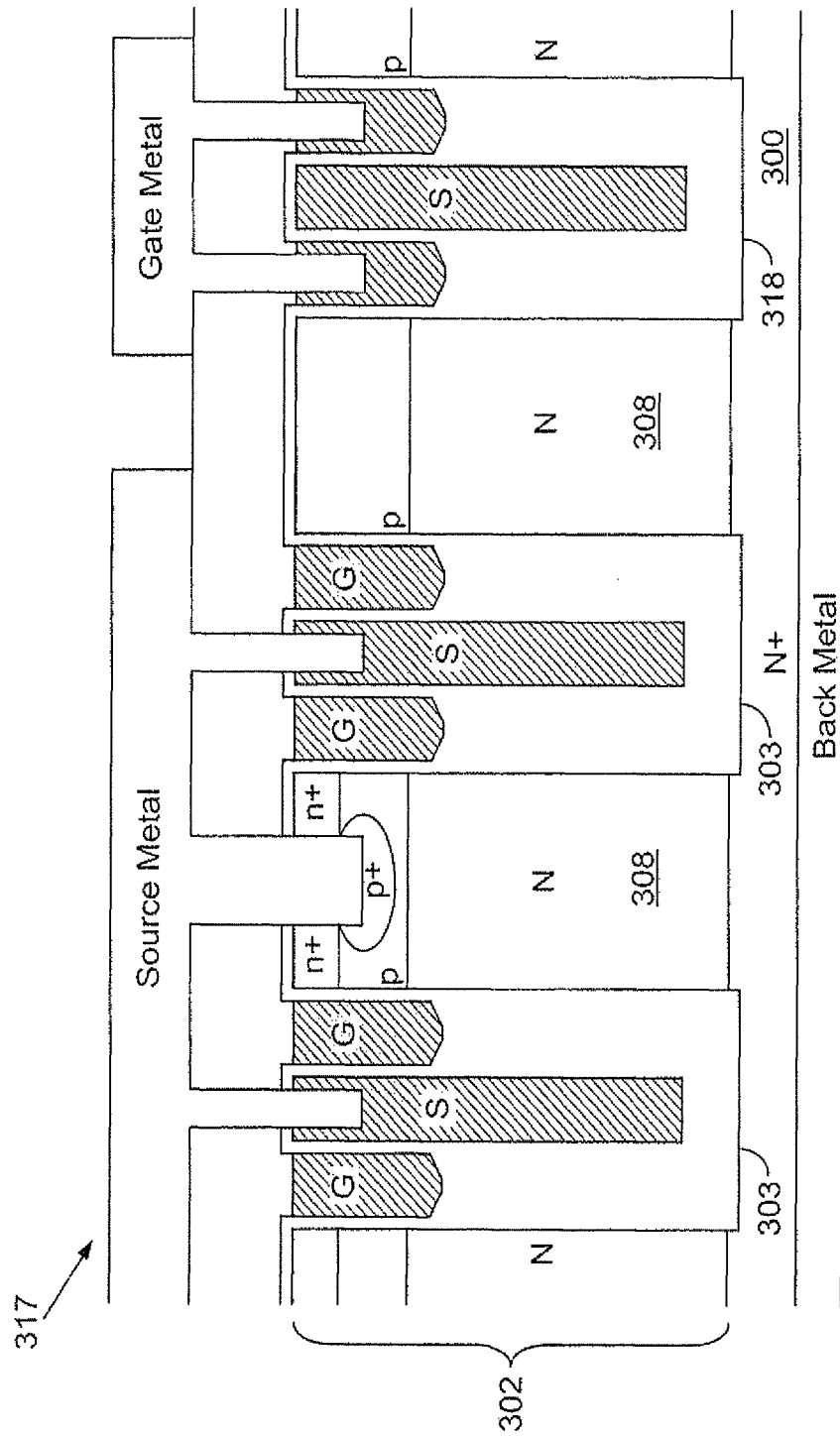
FIG. 3 is a cross-sectional view of another preferred embodiment according to the present invention.

FIG. 3 is a cross-sectional view of another preferred embodiment according to the present invention for showing an N-channel trench MOSFET 317 which is similar to the trench MOSFET 217 of FIG. 2B except that, in FIG. 3, the gate trenches 303 in the active area and the gate contact trench 318 are starting from the top surface of the epitaxial layer 302 and further extending into the N+ substrate 300. Besides, the N diffused drift region 308 is reaching the interface of the epitaxial layer 302 and the N+ substrate 300.

Figure 4:
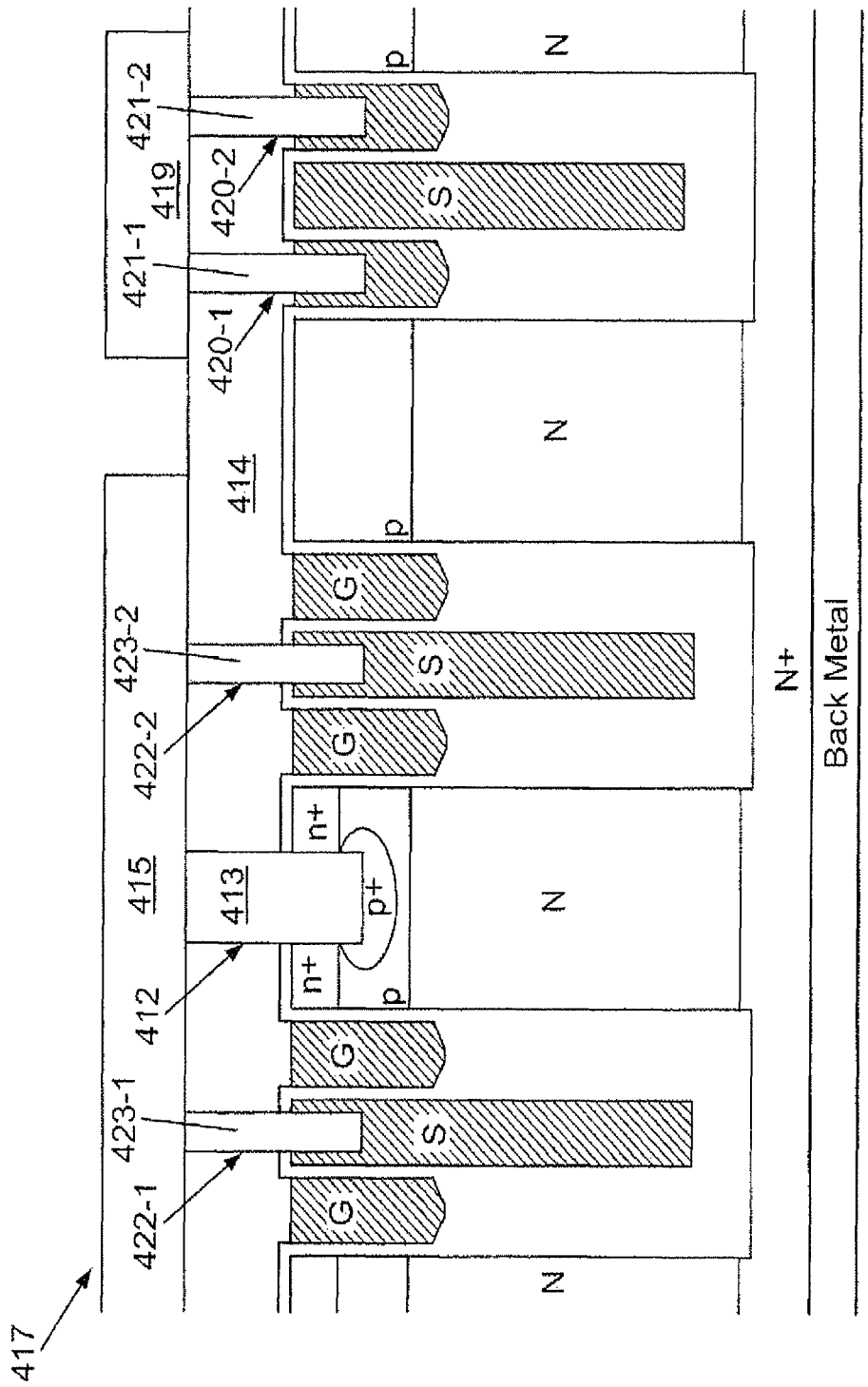
FIG. 4 is a cross-sectional view of another preferred embodiment according to the present invention.

FIG. 4 is a cross-sectional view of another preferred embodiment according to the present invention for showing an N-channel trench MOSFET 417 which is similar to the trench MOSFET 317 of FIG. 3 except that, in FIG. 4, the contact metal plugs (423-1 and 423-2) filled in the trenched source electrode contacts (422-1 and 422-2), the contact metal plug 413 filled in the trenched source-body contact 412, and the contact metal plugs (421-1 and 421-2) filled in the trenched gate contacts (420-1 and 420-2) are each implemented by using a tungsten metal layer padded by a barrier metal layer of Ti/TiN or Co/TiN. Meanwhile, the source metal 415 made of Al alloys or Cu is overlying onto the contact interlayer 414 and contacting with the contact metal plugs (423-1, 423-2 and 13) in the trenched source electrode contacts (422-1 and 422-2) and in the trenched source-body contact 412 respectively to be connected to the source electrodes, the gate metal 419 also made of Al alloys or Cu is overlying onto the contact interlayer 414 and contacting with the contact metal plugs (421-1 and 421-1) in the trenched gate electrode contacts (420-1 and 420-2) to be connected to the gate electrodes.

Figure 5A:
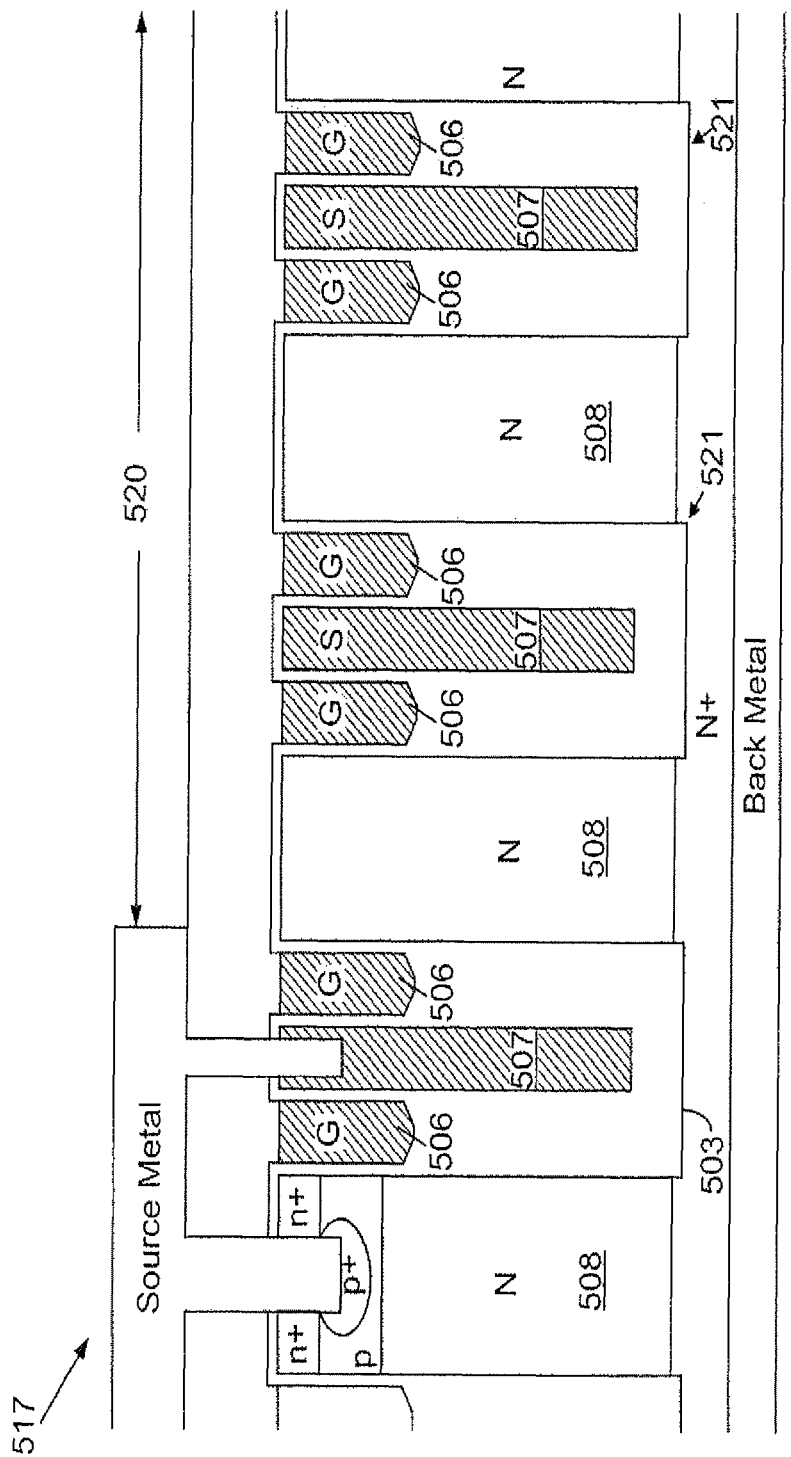
FIG. 5A is a cross-sectional view of another preferred embodiment according to the present invention.

FIG. 5A is a cross-sectional view of another preferred embodiment according to the present invention. Compared with the trench MOSFET 317 of FIG. 3, the trench MOSFET 517 of FIG. 5A further comprises a termination area 520 comprising multiple floating trenched gates trenches 521 having floating voltage and being spaced apart by the mesas comprising the N diffused drift region 508 without having the p body region, wherein the floating trenched gates 521 each comprises a source electrode 507 and a pair of split gate electrodes 506 which are same as those in the gate trenches 503 in the active area.

Figure 5B:
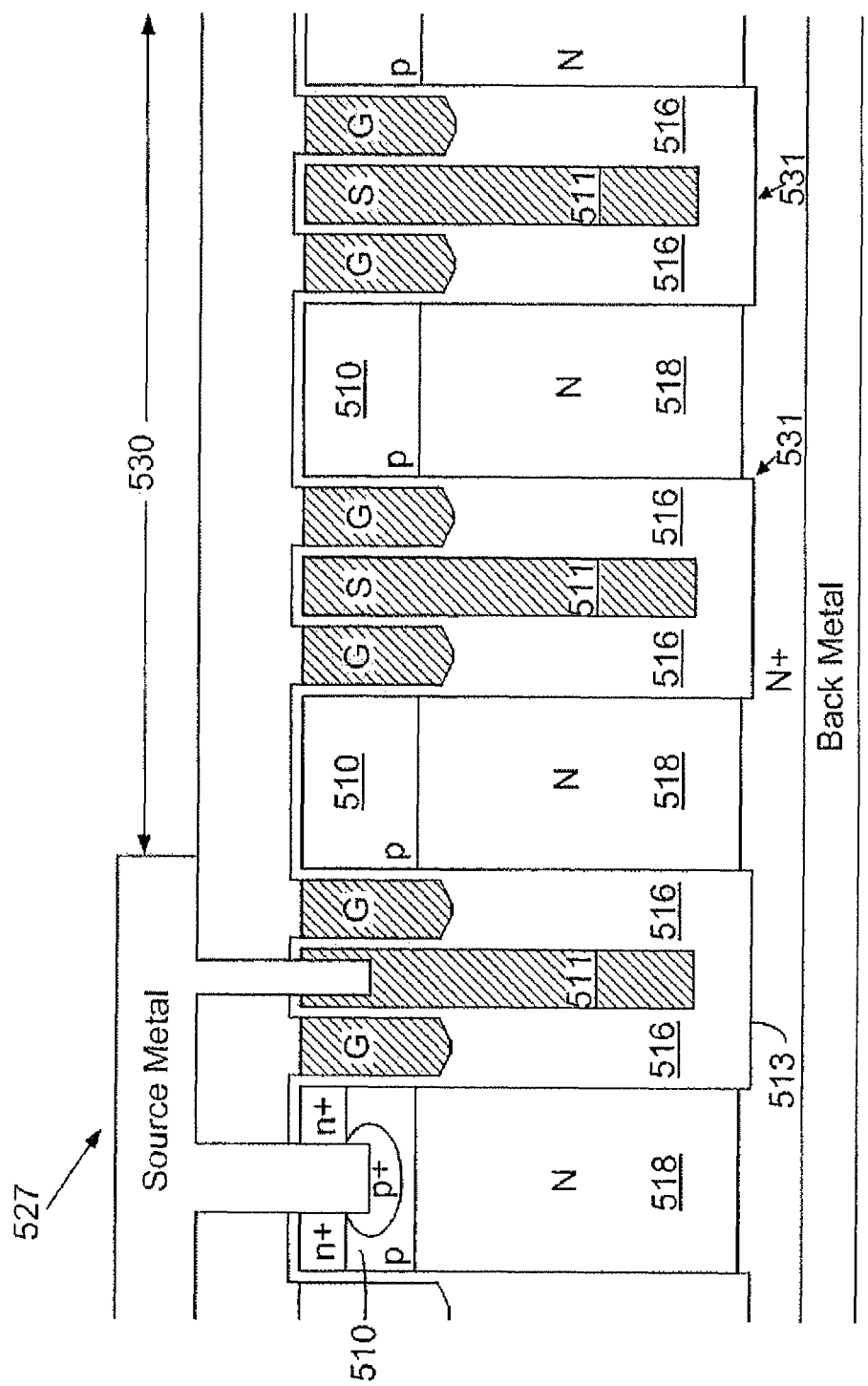
FIG. 5B is a cross-sectional view of another preferred embodiment according to the present invention.

FIG. 5B is a cross-sectional view of another preferred embodiment according to the present invention. Compared with the trench MOSFET 317 of FIG. 3, the trench MOSFET 527 of FIG. 5B further comprises a termination area 530 comprising multiple floating trenched gates 531 each has having floating voltage and being spaced apart by the mesas comprising the p body region 510 and the N diffused drift region 518, wherein the floating trenched gates 531 each comprises a source electrode 511 and a pair of split gate electrodes 516 which are the same as those in the gate trenches 513 in the active area.

Figure 5C:
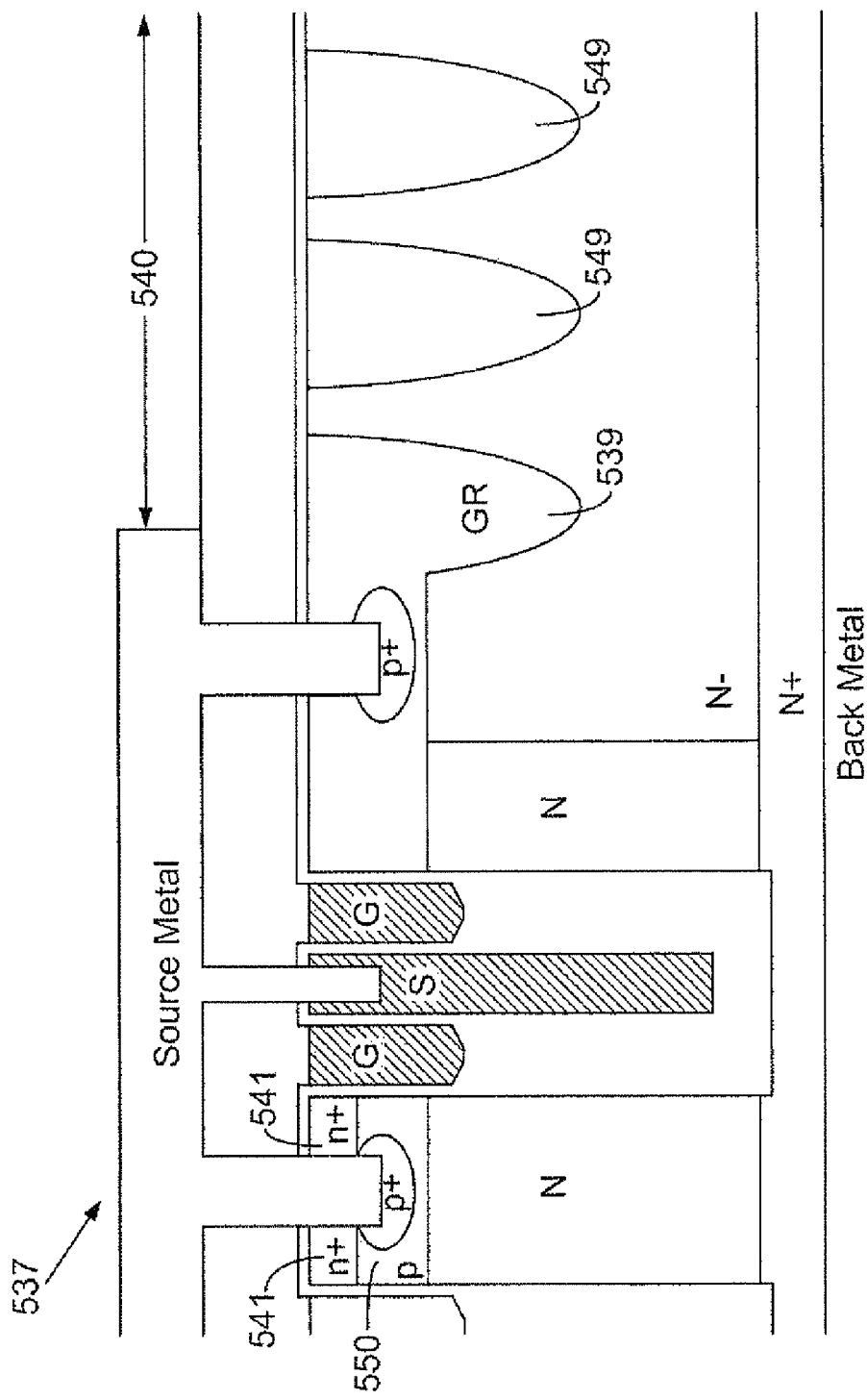
FIG. 5C is a cross-sectional view of another preferred embodiment according to the present invention.

FIG. 5C is a cross-sectional view of another preferred embodiment according to the present invention. Compared with the trench MOSFET 317 of FIG. 3, the trench MOSFET 537 of FIG. 5C further comprises a termination area 540 comprising a p type guard ring 539 (GR, as illustrated in FIG. 5C) connected with the n+ source region 541, and multiple p type floating guard rings 549 having floating voltage, wherein the p type guard ring 539 and the multiple p type floating guard rings 549 all have junction depths greater than the p body region 550.

Figure 6:
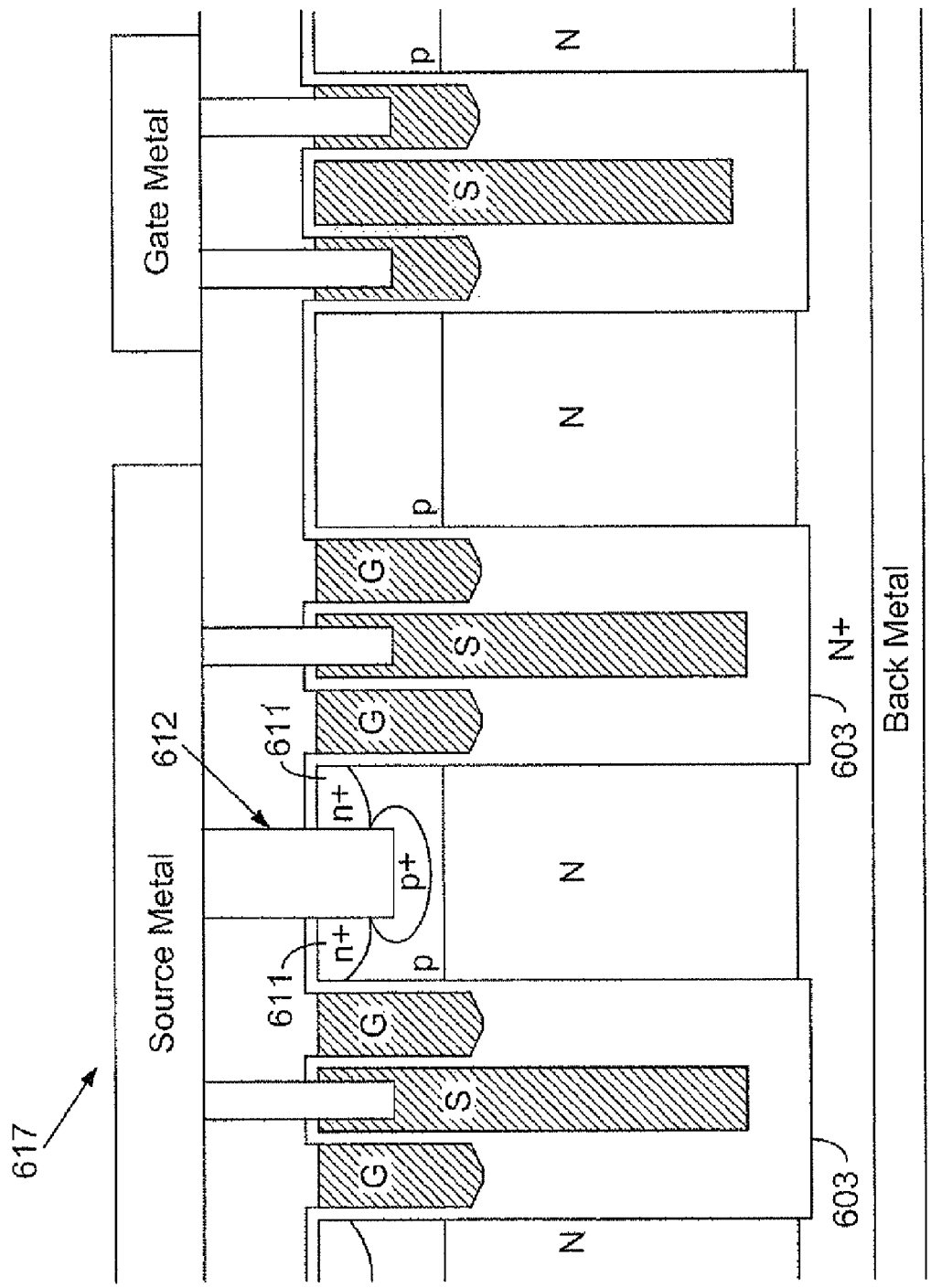
FIG. 6 is a cross-sectional view of another preferred embodiment according to the present invention.

FIG. 6 is a cross-sectional view of another preferred embodiment according to the present invention for showing a trench MOSFET 6 which is similar to the trench MOSFET 417 of FIG. 4 except that, in FIG. 6, the n+ source region 611 have a higher doping concentration and a greater junction depth along the sidewalls of the trenched source-body contact 612 than along adjacent channel regions near the trench sidewalls of the gate trenches 603, and the n+ source region 611 has a Gaussian-distribution doping profile from the sidewalls of the trenched source-body contact 612 to the adjacent channel regions near the trench sidewalls of the gate trenches 603.

Figure 7A:
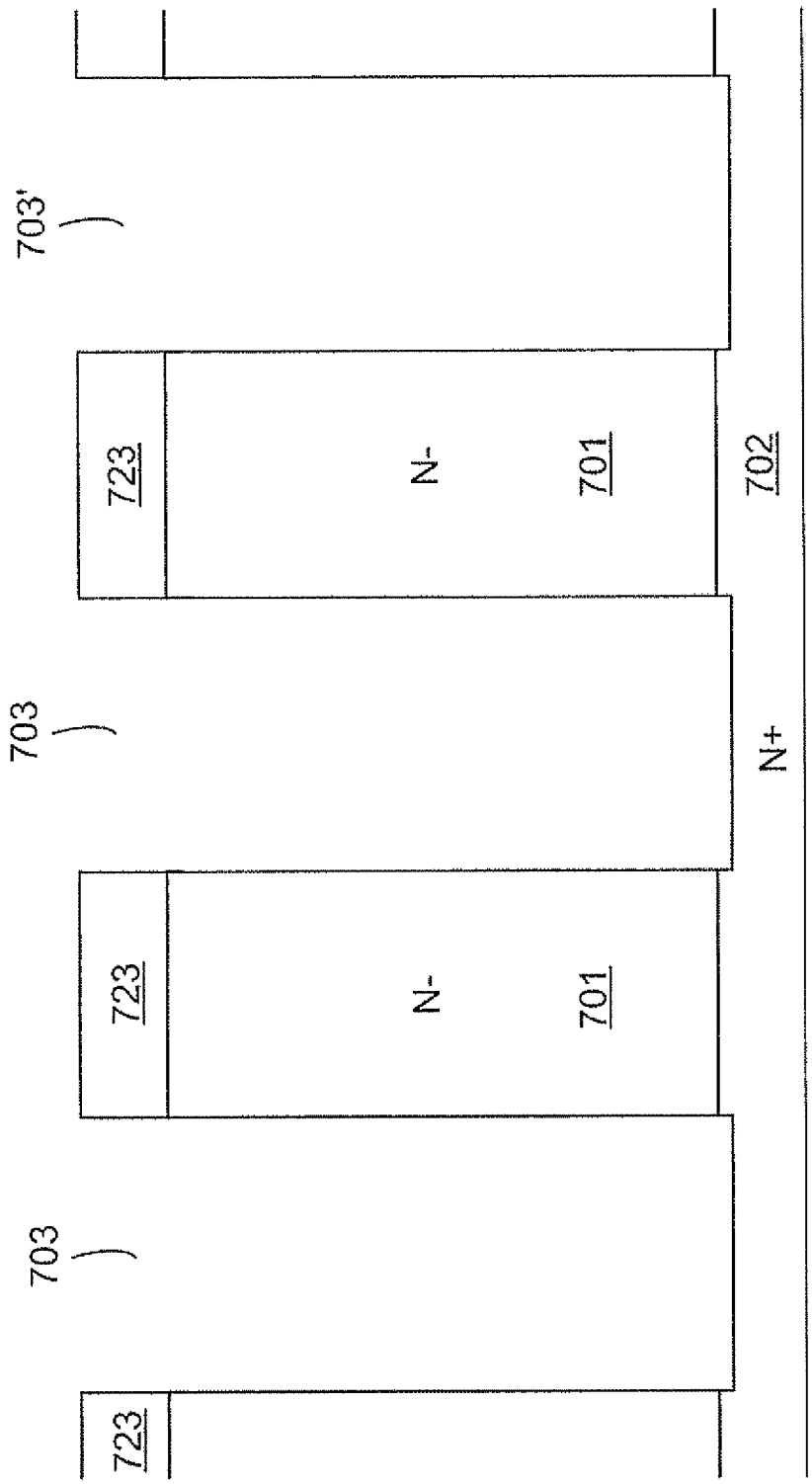
FIGS. 7A-7G are a serial of side cross-sectional views for showing the processing steps for fabricating the trench MOSFET of FIG. 4.

FIGS. 7A~7G are a serial of exemplary steps that are performed to form the inventive trench MOSFET 417 of FIG. 4. In FIG. 7A, an N− epitaxial layer 701 is grown on an N+ substrate 702. Next, a hard mask 723 such as an oxide layer is formed onto a top surface of the N− epitaxial layer 701 for definition of areas for a plurality of gate trenches. Then, after dry oxide etch and dry silicon etch, a plurality of gate trenches 703 are etched penetrating through open regions in the hard mask 723, the N− epitaxial layer 701 and extending into the N+ substrate 702. Meanwhile, at least a gate contact trench 703' is formed in the same steps, which is also starting from the top surface of the N− epitaxial layer 701 and extending into the N+ substrate 702. As an alternative, the gate trenches can be formed having trench bottoms disposed above the N+ substrate 702. Mesas are formed between every two adjacent gate trenches 703 and the gate contact trench 703' in the N− epitaxial layer 701.

Figure 7B:
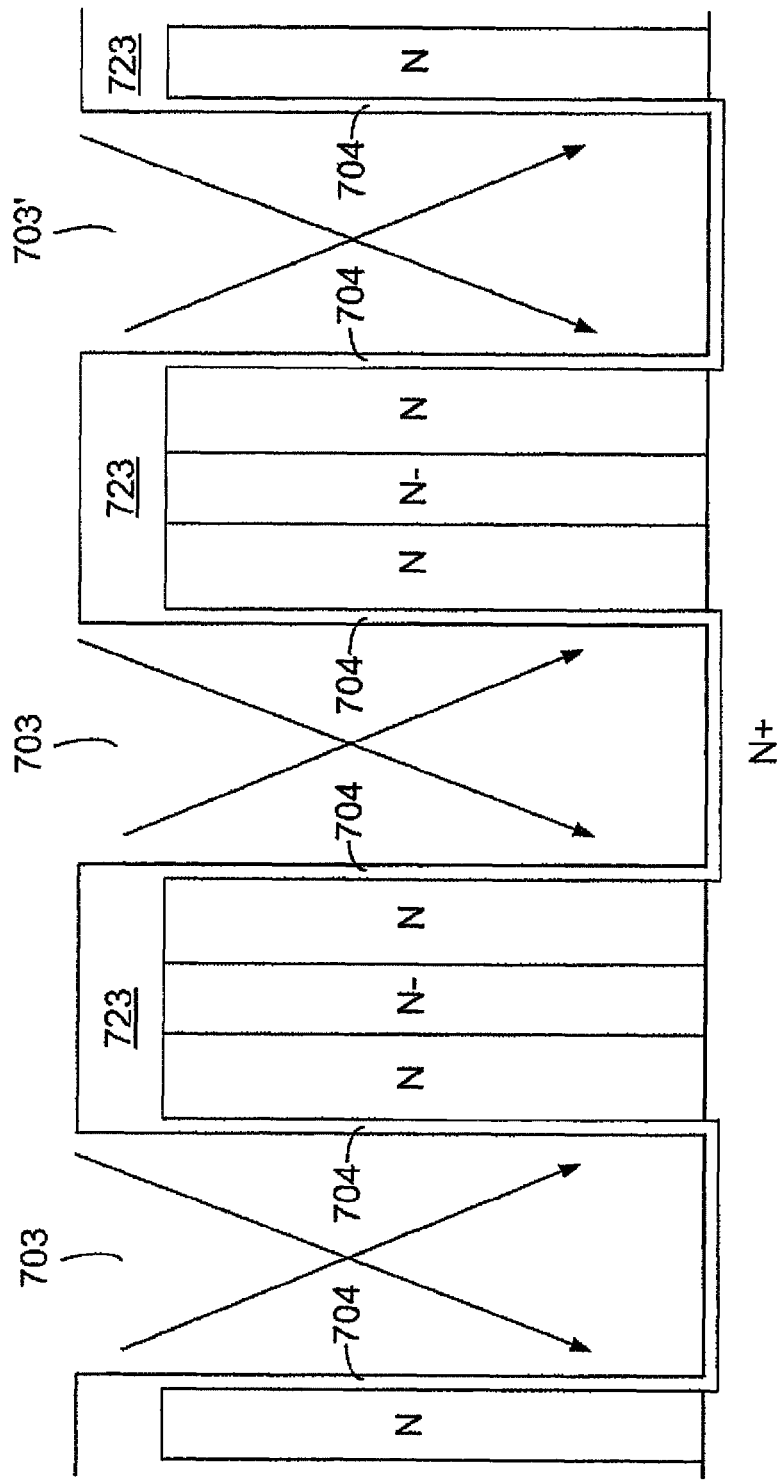
Figure 7C:
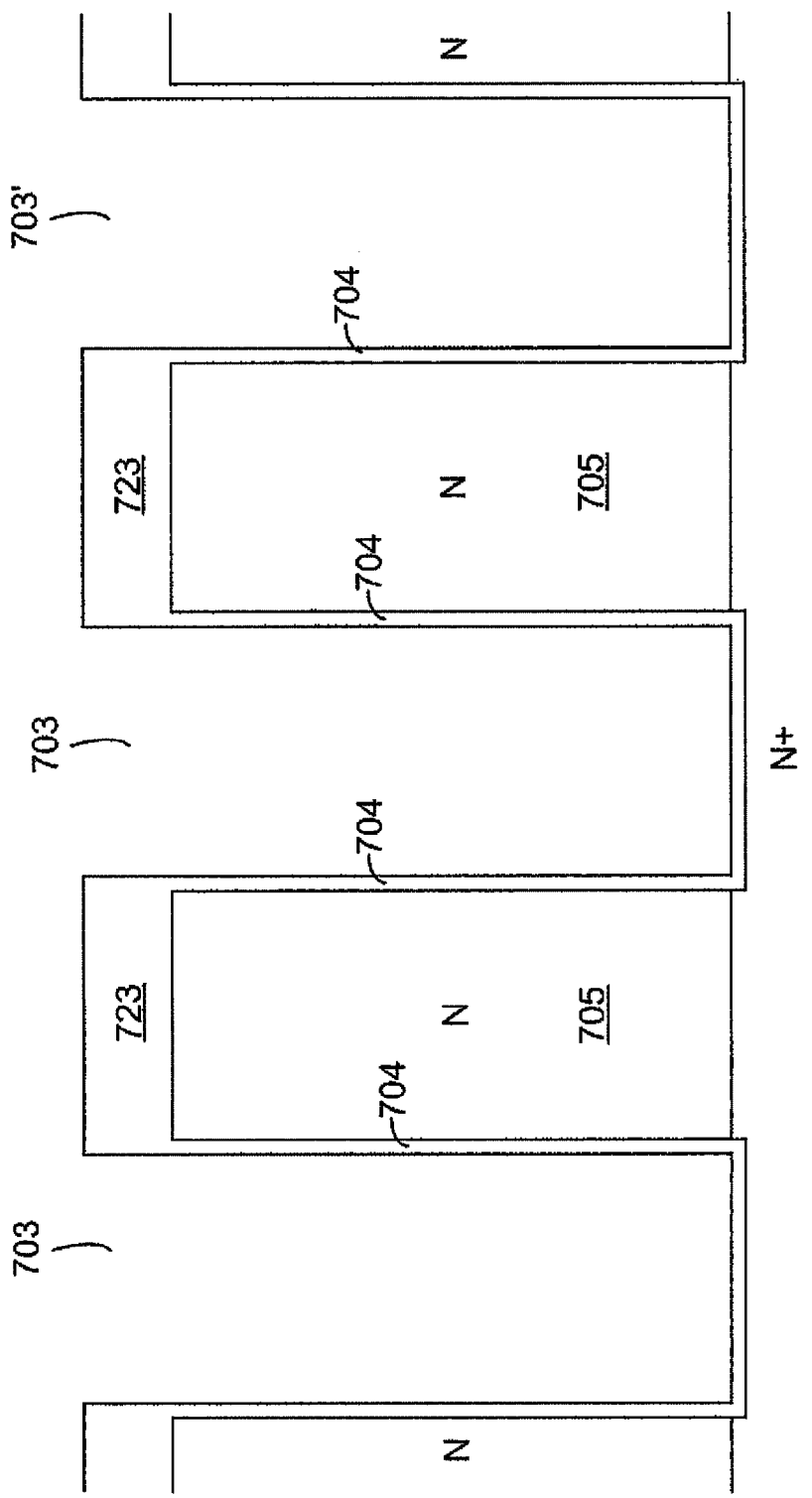

In FIG. 7B, a sacrificial oxide layer (not shown) is first grown and then removed to eliminate the plasma damage after forming the gate trenches 703 and the gate contact trench 703'. Keeping the hard mask 723 substantially covering the mesas, a screen oxide 704 is grown along an inner surface of the gate trenches 703 and the gate contact trench 703'. Then, a step of angle Ion Implantation of Arsenic or Phosphorus dopant into the mesas is carried out through the open regions in the hard mask 703 and sidewalk of the gate trenches, and followed by a diffusion step as shown in FIG. 7C to form a plurality of N diffused drift regions 705 in the mesas. Therefore, the N diffused drift region 705 has a higher doping concentration along trench sidewalls of the gate trenches 703 and the gate contact trench 703' than in center of the mesas. And the doping profile of the N diffused drift regions 705 is much easier to control than the multiple epitaxial layers in the prior arts.

Figure 7D:
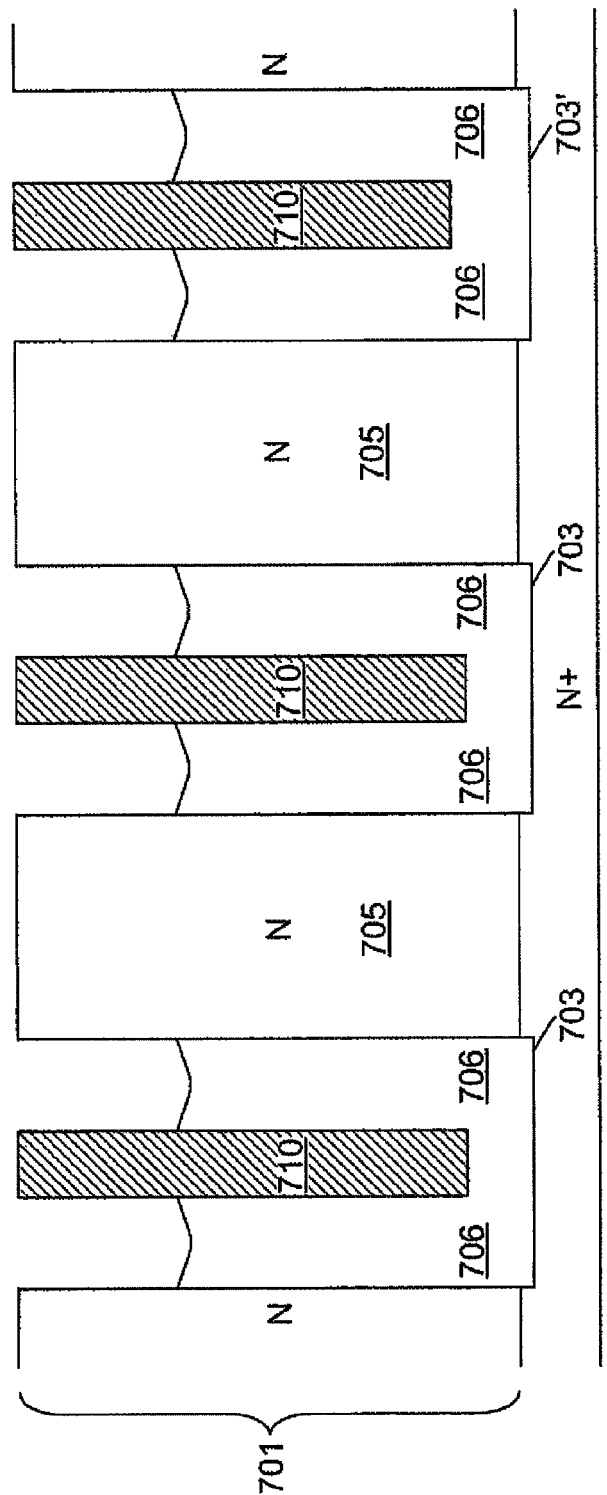

In FIG. 7D, the hard mask 723 and the screen oxide 704 (as illustrated in FIG. 7C) are firstly removed. Then, a first gate insulation layer 706 comprising a thick oxide layer is formed lining the inner surface of the gate trenches by thermal oxide growth or thick oxide deposition. Then, a first doped poly-silicon layer is deposited onto the first gate insulation layer 706 to fill the gate trenches 703 and the gate contact trench 703', and is then etched back from the top surface of the epitaxial layer 701 to serve as a source electrode 710. Next, the first gate insulation layer 706 is etched back from top surface of the epitaxial layer and an upper portion of the gate trenches 703 and the gate contact trench 703'.

Figure 7E:
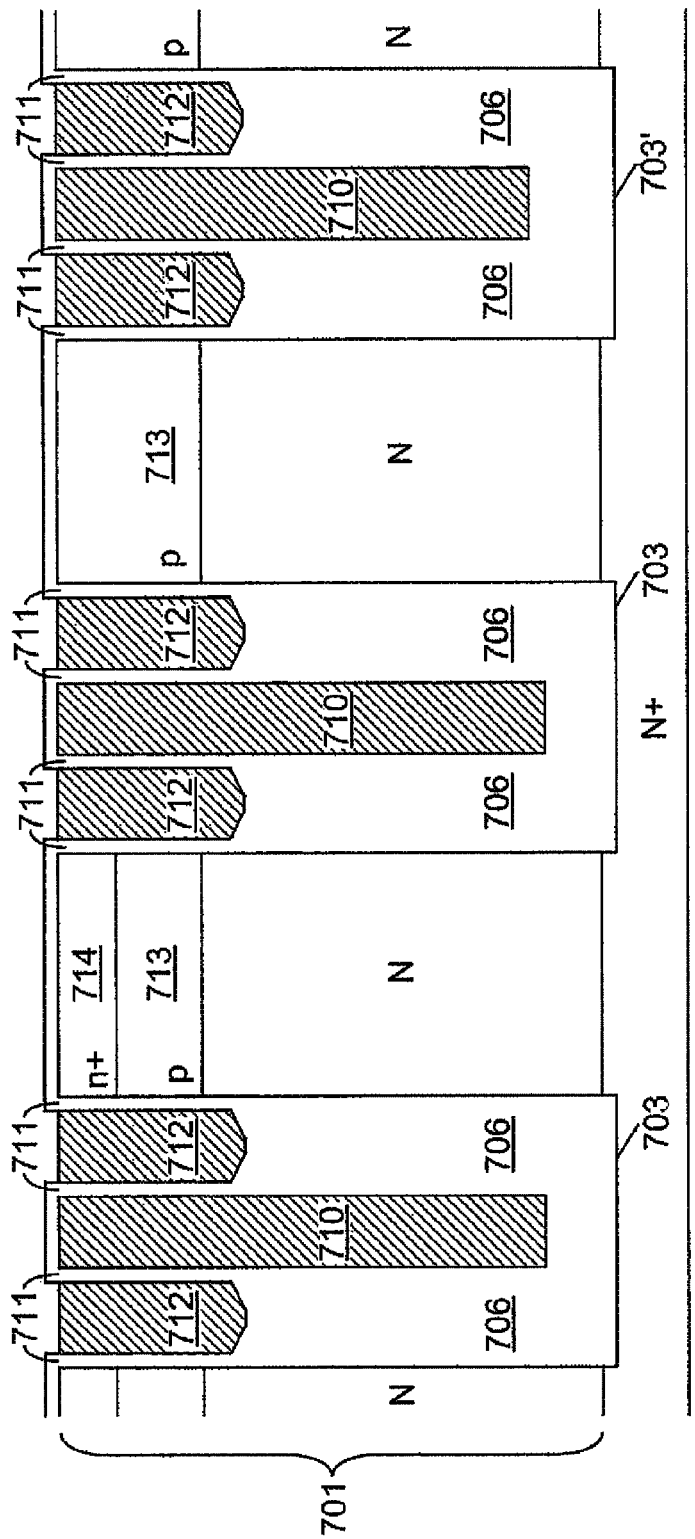

In FIG. 7E, a second gate insulation layer 711 comprising a thin oxide layer is grown along upper inner surfaces of the gate trenches 703 and the gate contact trench 703', covering a top surface of the first gate insulation layer 706 and along sidewalls of the source electrode 710 above the top surface of the first gate insulation layer 706. After that, a second doped poly-silicon layer is deposited filling the upper portion of the gate trenches 703 and the gate contact trench 703', and is then etched back by CMP (Chemical Mechanical Polishing) or Plasma Etch to serve as split gate electrodes 712. Therefore, no mask is required for definition of the location of the split gate electrodes 712, and one mask is saved for cost reduction. Each of the split gate electrodes 712 is symmetrically disposed in the middle between the source electrode 710 and adjacent trench sidewall in the gate trenches 703 and the gate contact trench 703'. Then, a body implantation of p conductivity type dopant is carried out over entire top surface to form p body regions 713 between every two adjacent gate trenches 703 and the gate contact trench 703'. After applying a source mask (not shown) onto the top surface of the epitaxial layer 701, a source implantation of n conductivity type dopant and a diffusion step are successively carried out to form an n+ source region 714 near a top surface of the p body regions 713 between two adjacent gate trenches 703 in an active area.

Figure 7F:
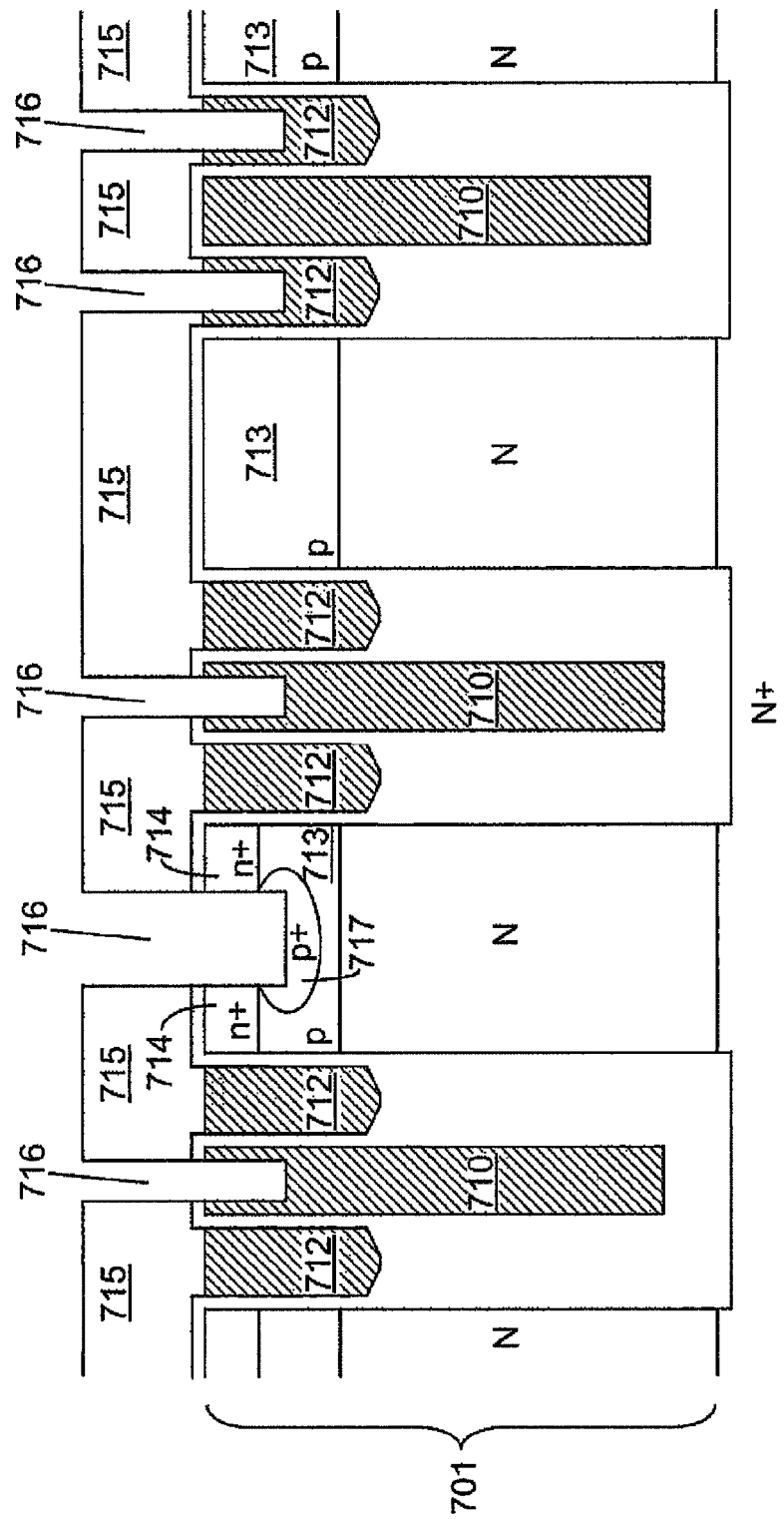

In FIG. 7F, another oxide layer is deposited onto the top surface of the epitaxial layer 701 to serve as a contact interlayer 715. Then, after applying a contact mask (not shown) onto the contact interlayer 715, a plurality of trenched contacts 716 are formed by successively dry oxide etch and dry silicon etch penetrating through the contact interlayer 715, and extending into the p body regions 713 for trenched source-body contacts, into the source electrodes 710 for trenched source electrode contacts, and into the split gate electrodes 712 for trenched gate contacts, respectively. Next, a BF2 Ion Implantation is performed to form a p+ body contact doped region 717 within the p body regions 713 and surrounding at least bottom of the trenched source body-contacts penetrating through the n+ source region 714 and extending into the p body region 713.

Figure 7G:
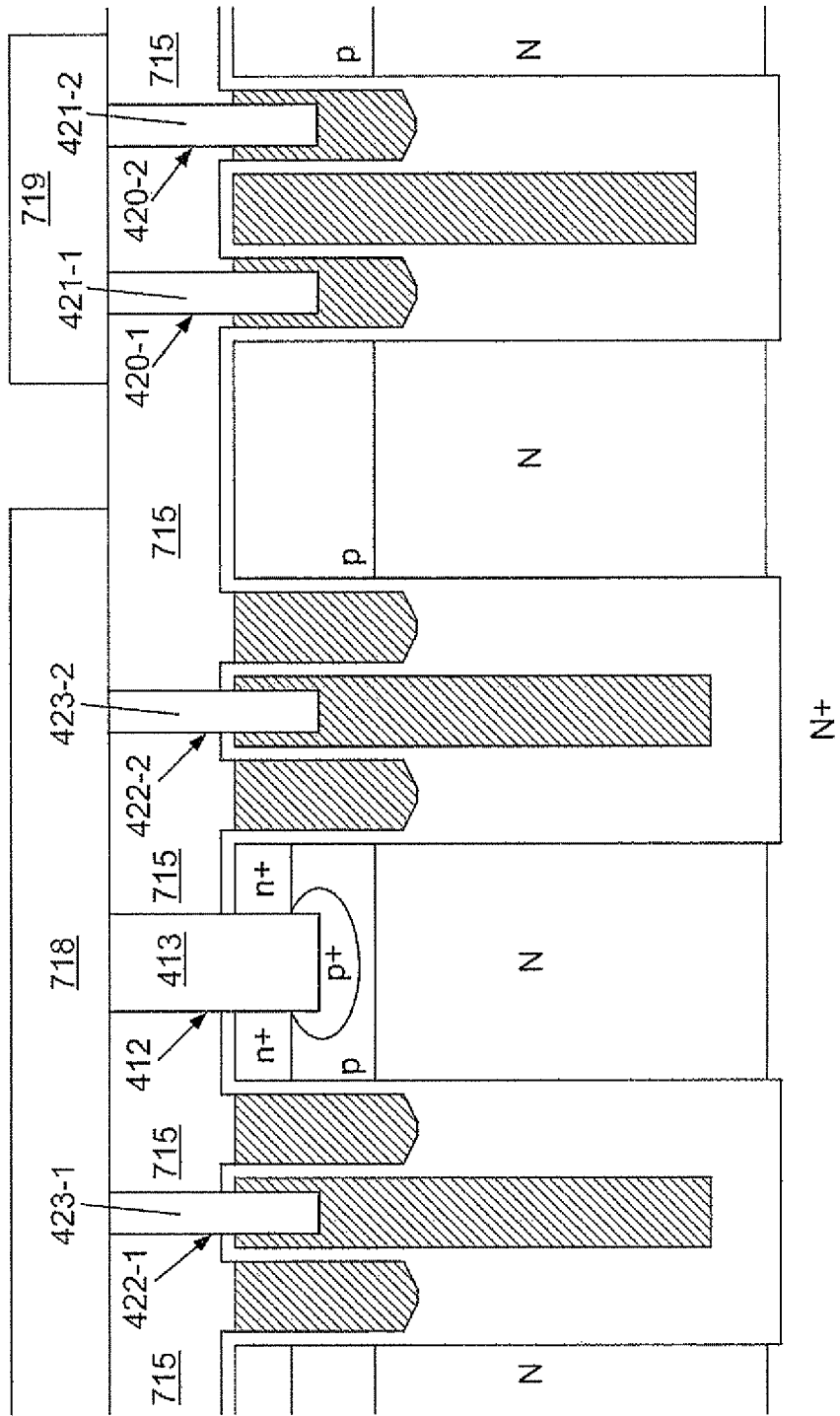

In FIG. 7G, a barrier metal layer of Ti/TiN or Co/TiN or Ta/TiN is deposited on sidewalls and bottoms of all the trenched contacts 716 followed by a step of RTA process for silicide formation. Then, a tungsten material layer is deposited onto the barrier layer, wherein the tungsten material layer and the barrier layer are then etched back to form: contact metal plugs (423-1 and 423-2) for the trenched source electrode contacts (422-1 and 422-2); contact metal plug 413 for the trenched source-body contacts 412; and contact metal plugs (421-1 and 421-2) for the trenched gate contacts (420-1 and 420-2). Then, a metal layer of Al alloys or Cu padded by a resistance-reduction layer Ti or Ti/TiN underneath is deposited onto the contact interlayer 715 and followed by a metal etching process by employing a metal mask (not shown) to be patterned as a source metal 718 and a gate metal 719.

Although the present invention has been described in terms of the presently preferred embodiments, it is to be understood that such disclosure is not to be interpreted as limiting. Various alternations and modifications will no doubt become apparent to those skilled in the art reading the above disclosure. Accordingly, it is intended that the appended claims be interpreted as covering all alternations and modifications as fall within the true spirit and scope of the invention.

What is claimed is:

1. A trench MOSFET comprising:
a substrate of a first conductivity type;
an epitaxial layer of said first conductivity type onto said substrate, said epitaxial layer having a lower doping concentration than said substrate;
a plurality of gate trenches formed from a top surface of said epitaxial layer and extending downward into said epitaxial layer in an active area;
a first gate insulation layer formed along trench sidewalls of a lower portion of each of said gate trenches;
a source electrode formed within each of said gate trenches and surrounded by said first gate insulation layer in said lower portion of each of said gate trenches;
a second gate insulation layer formed at least along trench sidewalls of an upper portion of each of said gate trenches and upper sidewalls of said source electrode above said first gate insulation layer, said second gate insulation layer having a thinner thickness than said first gate insulation layer;
a pair of split gate electrodes of said first conductivity type disposed adjacent to said second gate insulation layer and above said first gate insulation layer in said upper portion of each of said gate trenches, wherein each of said split gate electrodes disposed in the middle between said source electrode and adjacent trench sidewall in said gate trenches;
a diffused drift region of said first conductivity and having a higher doping concentration than said epitaxial layer, disposed in a mesa between two adjacent said gate trenches;
said diffused drift region having a higher doping concentration near trench sidewalls of said gate trenches than in the center of said mesa;
a body region of a second conductivity type formed in said mesa, above a top surface of said diffused drift region; and
a source region of said first conductivity type formed near a top surface of said body region and adjacent to said split gate electrodes.

2. The trench MOSFET of claim 1, wherein said source electrode and said split gate electrodes comprise a doped poly-silicon of said first conductivity type.

3. The trench MOSFET of claim 1, wherein said source electrode comprises a doped poly-silicon of said second conductivity type and said split gate electrodes comprise a doped poly-silicon of said first conductivity type.

4. The trench MOSFET of claim 1, wherein trench bottoms of said gate trenches are above a common interface between said substrate and said epitaxial layer.

5. The trench MOSFET of claim 1, wherein said gate trenches further extend into said substrate.

6. The trench MOSFET of claim 1 further comprising a termination area which comprises a guard ring connected with said source region, and multiple floating guard rings having floating voltage, wherein said guard ring and said multiple floating guard rings of said second conductivity type have junction depths greater than said body region.

7. The trench MOSFET of claim 1 further comprising a termination area which comprises multiple floating trenched gates each having floating voltage and being spaced apart by said mesa comprising said body region and said diffused drift region; and said floating trenched gates each comprising a source electrode and a pair of split gate electrodes which are the same as those in said gate trenches.

8. The trench MOSFET of claim 1 further comprising a termination area which comprises multiple floating trenched gates each having floating voltage and being spaced apart by said mesa comprising said diffused drift region without having said body region; and said floating trenched gates each comprising a source electrode and a pair of split gate electrodes which are the same as those in said gate trenches.

9. The trench MOSFET of claim 1, wherein said source region has a uniform doping concentration and junction depth between sidewalls of said trenched source-body contacts to adjacent channel regions near trench sidewalls of said gate trenches.

10. The trench MOSFET of claim 1, wherein said source region has a higher doping concentration and a greater junction depth along sidewalls of said trenched source-body contact than along adjacent channel regions near trench sidewalls of said gate trenches, and said source region has a Gaussian-distribution doping profile from the sidewalls of said trenched source-body contact to said adjacent channel regions near trench sidewalls of said gate trenches.

11. The trench MOSFET of claim 1 further comprising at least a trenched source electrode contact filled with said contact metal plug and connecting said source electrode to a source metal.

12. The trench MOSFET of claim 1 further comprising at least a gate contact trench filling with a source electrode and a pair of split gate electrodes for gate connection, and further comprising at least a trenched gate contact filled with said contact metal plug and extending into said split gate electrodes in said gate contact trench to connect said split gate electrodes to a gate metal.

13. The trench MOSFET of claim 1 further comprising:
a trenched source-body contact filled with a contact metal plug and penetrating through said source region and extending into said body region; and a body contact doped region of said second conductivity type within said body region and surrounding at least bottom of said trenched source-body contact underneath said source region, wherein said body contact doped region has a higher doping concentration than said body region.

14. The trench MOSFET of claim 13, wherein said contact metal plug is a tungsten metal layer padded by a barrier metal layer of Ti/TiN or Co/TiN.

15. The trench MOSFET of claim 13, wherein said contact metal plug is Al alloys or Cu padded by a barrier metal layer of Ti/TiN or Co/TiN or Ta/TiN, wherein said contact metal plug also extends onto a contact interlayer to be respectively formed as a source metal or a gate metal.

* * * * *